(12) United States Patent
Meng et al.

(10) Patent No.: US 9,620,452 B2
(45) Date of Patent: Apr. 11, 2017

(54) VIA STRUCTURE FOR OPTIMIZING SIGNAL POROSITY

(71) Applicant: QUALCOMM Incorporated, San Diego, CA (US)

(72) Inventors: Xiongfei Meng, Carlsbad, CA (US); Joon Hyung Chung, San Marcos, CA (US); Yuancheng Christopher Pan, Saratoga, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 15/346,693

(22) Filed: Nov. 8, 2016

(65) Prior Publication Data

US 2017/0053866 A1 Feb. 23, 2017

Related U.S. Application Data

(62) Division of application No. 14/744,634, filed on Jun. 19, 2015, now Pat. No. 9,520,358.

(Continued)

(51) Int. Cl.
*H01L 23/528* (2006.01)
*H01L 23/535* (2006.01)
(Continued)

(52) U.S. Cl.
CPC ........ *H01L 23/528* (2013.01); *H01L 23/5226* (2013.01); *H01L 23/5286* (2013.01); *H01L 23/535* (2013.01); *H01L 27/0617* (2013.01)

(58) Field of Classification Search
None
See application file for complete search history.

(56) References Cited

U.S. PATENT DOCUMENTS 6,696,712 B1 2/2004 Yonesaka
8,258,600 B2 9/2012 Sugisaki et al.
(Continued)

OTHER PUBLICATIONS

International Search Report and Written Opinion—PCT/US2015/053937—ISA/EPO—Jan. 5, 2016.

*Primary Examiner* — Andres Munoz
(74) *Attorney, Agent, or Firm* — Arent Fox LLP (57) ABSTRACT

An apparatus including a conductive stack structure includes an $M_x$ layer interconnect on an $M_x$ layer and extending in a first direction on a first track, an $M_y$ layer interconnect on an $M_y$ layer in which the $M_y$ layer is a lower layer than the $M_x$ layer, a first via stack coupled between the $M_x$ layer interconnect and the $M_y$ layer interconnect, a second via stack coupled between the $M_x$ layer interconnect and the $M_y$ layer interconnect, a second $M_x$ layer interconnect extending in the first direction on a track immediately adjacent to the first track, and a third $M_x$ layer interconnect extending in the first direction on a track immediately adjacent to the first track. The $M_x$ layer interconnect is between the second $M_x$ layer interconnect and the third $M_x$ layer interconnect. The second $M_x$ layer interconnect and the third $M_x$ layer interconnect are uncoupled to each other.

16 Claims, 6 Drawing Sheets

Related U.S. Application Data

(60) Provisional application No. 62/072,966, filed on Oct. 30, 2014.

(51) Int. Cl.
*H01L 23/522* (2006.01)
*H01L 27/06* (2006.01)

(56) References Cited

U.S. PATENT DOCUMENTS

| | | |
|---|---|---|
| 8,378,450 B2 | 2/2013 | Booth, Jr. et al. |
| 8,503,159 B2 * | 8/2013 | Lin |
| 8,741,763 B2 * | 6/2014 | Ma ............... H01L 23/528 |
| | | 257/E21.249 |
| 9,496,217 B2 * | 11/2016 | Tsai ............... H01L 21/76804 |
| 9,520,358 B2 | 12/2016 | Meng |
| 2001/0045670 A1 | 11/2001 | Nojiri |
| 2002/0162079 A1 | 10/2002 | Igarashi et al. |
| 2006/0157739 A1 | 7/2006 | Tamiya |
| 2009/0166894 A1 | 7/2009 | Azumai |
| 2012/0286393 A1 | 11/2012 | Lin et al. |
| 2013/0063203 A1 | 3/2013 | Utsumi et al. |
| 2014/0035100 A1 | 2/2014 | Cho |
| 2014/0252644 A1 | 9/2014 | O'Brien et al. |
| 2014/0252650 A1 | 9/2014 | Utsumi |
| 2016/0126180 A1 | 5/2016 | Meng et al. |

* cited by examiner

FIG. 6

VIA STRUCTURE FOR OPTIMIZING SIGNAL POROSITY

CROSS-REFERENCE TO RELATED APPLICATION(S)

This application is a Division of U.S. Non-Provisional application Ser. No. 14/744,634 entitled "VIA STRUCTURE FOR OPTIMIZING SIGNAL POROSITY" and filed Jun. 19, 2015, which claims the benefit of U.S. Provisional Application Ser. No. 62/072,966, entitled "VIA STRUCTURE FOR OPTIMIZING SIGNAL POROSITY" and filed on Oct. 30, 2014, both of which are expressly incorporated by reference herein in their entirety.

BACKGROUND

Field

The present disclosure relates generally to a layout construction, and more particularly, to a via structure for optimizing signal porosity.

Background

A standard cell is an integrated circuit that may be implemented with digital logic. An application-specific integrated circuit (ASIC), such as a system-on-a-chip (SoC) device, may contain thousands to millions of standard cells. Reducing a size/area footprint of ASICs is beneficial. Improving a signal porosity/routability may allow for the size/area footprint of ASICs to be reduced. Accordingly, there is a need for improving signal porosity/routability.

SUMMARY

In an aspect of the disclosure, an apparatus includes a conductive stack structure, and the apparatus may include a metal x ($M_x$) layer interconnect on an $M_x$ layer that extends in a first direction on a first track, a metal y ($M_y$) layer interconnect on an $M_y$ layer in which the $M_y$ layer is a lower layer than the $M_x$ layer, a first via stack, and a second via stack. The first via stack is coupled between the $M_x$ layer interconnect and the $M_y$ layer interconnect. The first via stack includes a first metal x-1 ($M_{x-1}$) layer interconnect on an $M_{x-1}$ layer and includes a plurality of vias. The first $M_{x-1}$ layer interconnect is a higher layer than the $M_y$ layer interconnect. The first $M_{x-1}$ layer interconnect extends in a second direction on a second track. The second direction is orthogonal to the first direction. The plurality of vias include a first via connected to the $M_x$ layer interconnect and the first $M_{x-1}$ layer interconnect within an overlapping portion of the first track and the second track. The plurality of vias include a second via coupled between the $M_y$ layer interconnect and the first $M_{x-1}$ layer interconnect. The second via is within an overlapping portion of the first track and the second track. The second via stack is coupled between the $M_x$ layer interconnect and the $M_y$ layer interconnect. The second via stack includes a second $M_{x-1}$ layer interconnect and a second plurality of vias. The second $M_{x-1}$ layer interconnect extends in the second direction on a third track. The second plurality of vias include a third via connected to the $M_x$ layer interconnect and the second $M_{x-1}$ layer interconnect within an overlapping portion of the first track and the third track. The second plurality of vias include a fourth via coupled between the $M_y$ layer interconnect and the second $M_{x-1}$ layer interconnect. The fourth via is within an overlapping portion of the first track and the third track. The apparatus may further include a second $M_x$ layer interconnect extending in the first direction on a fourth track immediately adjacent to the first track. The apparatus may further include a third $M_x$ layer interconnect extending in the first direction on a fifth track immediately adjacent to the first track. The $M_x$ layer interconnect is between the second $M_x$ layer interconnect and the third $M_x$ layer interconnect. The second $M_x$ layer interconnect and the third $M_x$ layer interconnect are uncoupled to each other.

In an aspect of the disclosure, an apparatus includes conductive stack structure, and the apparatus may include a first $M_x$ layer interconnect extending in a first direction on a first track, a second $M_x$ layer interconnect extending in the first direction on a second track, an $M_y$ layer interconnect in which the $M_y$ layer is a lower layer than the $M_x$ layer, a first via stack, and a second via stack. The first via stack is coupled between the first $M_x$ layer interconnect and the $M_y$ layer interconnect. The first via stack includes an $M_{x-1}$ layer interconnect and a plurality of vias. The $M_{x-1}$ layer interconnect is a higher layer than the $M_y$ layer interconnect. The $M_{x-1}$ layer interconnect extends in a second direction on a third track. The second direction is orthogonal to the first direction. The plurality of vias include a first via connected to the first $M_x$ layer interconnect and the $M_{x-1}$ layer interconnect within an overlapping portion of the first track and the third track. The plurality of vias include a second via coupled between the $M_y$ layer interconnect and the $M_{x-1}$ layer interconnect. The second via is within an overlapping portion of the first track and the third track. The second via stack is coupled between the second $M_x$ layer interconnect and the $M_y$ layer interconnect. The second via stack includes the $M_{x-1}$ layer interconnect and a second plurality of vias. The second plurality of vias include a third via connected to the second $M_x$ layer interconnect and the $M_{x-1}$ layer interconnect within an overlapping portion of the second track and the third track. The second plurality of vias include a fourth via coupled between the $M_y$ layer interconnect and the $M_{x-1}$ layer interconnect. The fourth via is within an overlapping portion of the second track and the third track. The apparatus may further include a third $M_x$ layer interconnect extending in the first direction on a fourth track immediately adjacent to the first track and the second track. The third $M_x$ layer interconnect extends between the first $M_x$ layer interconnect and the second $M_x$ layer interconnect. The third $M_x$ layer interconnect is uncoupled to the first $M_x$ layer interconnect and the second $M_x$ layer interconnect.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Apparatuses and methods will be described in the following detailed description and may be illustrated in the accompanying drawings by various blocks, modules, components, circuits, steps, processes, algorithms, elements, etc.

Signal porosity/routability and power/ground (PG) strength are inversely related. Reducing PG strength of a set of via power/ground stacks (i.e., increasing a resistance of the set of via power/ground stacks) may increase signal porosity/routability if the via power/ground stacks block less routing tracks. The via power/ground stacks may block less routing tracks if the via power/ground stacks are smaller (e.g., have smaller vias) and/or the number of via power/ground stacks is reduced within the set of via power/ground stacks. Increasing PG strength of a set of via power/ground stacks (i.e., reducing a resistance of the set of via power/ground stacks) may decrease signal porosity/routability if the via power/ground stacks block more routing tracks. The via power/ground stacks may block more routing tracks if the via power/ground stacks are bigger (e.g., have wider/longer vias) and/or the number of via power/ground stacks is increased within the set of via power/ground stacks. Higher signal porosity/routability leads to a smaller die size and potentially less power consumption of ASICs on the die. PG strength is required to meet an IR (i.e., voltage) drop target/requirement to ensure power integrity. Accordingly, there is currently a need to ensure PG strength while delivering good signal porosity/routability to maintain a requisite die size.

Figure 1A:
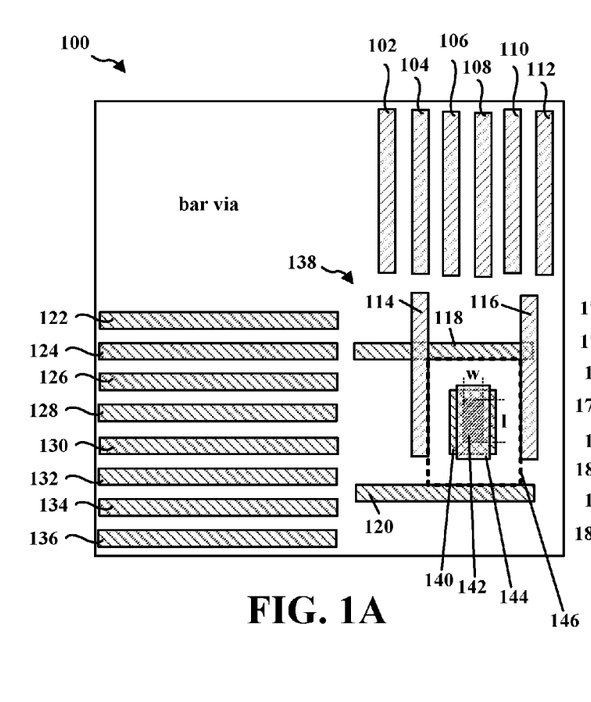
FIG. 1A is a diagram illustrating a top view of a bar type via structure.

FIG. 1A is a diagram 100 illustrating a bar type via structure 138. The bar type via structure 138 is a via stack that may be used to provide power (e.g., $V_{dd}$)/ground (e.g., $V_{ss}$) to lower metal layers. The bar type via structure 138 includes a metal x ($M_x$) layer interconnect 144, a metal x-1 ($M_{x-1}$) layer interconnect 140, and a via 142 connecting the $M_x$ layer interconnect 144 to the $M_{x-1}$ layer interconnect 140. The $M_x$ layer interconnect 144 extends in the first direction, and the $M_{x-1}$ layer interconnect 140 extends in the second direction orthogonal to the first direction. The pattern of interconnects and vias may repeat until the via stack reaches the lower metal layers. The $M_x$ layer interconnects 114 and 116 and the $M_{x-1}$ layer interconnects 118 and 120 are shown merely to help illustrate the boundaries of the bar type via structure 138, and are not part of the bar type via structure 138. Further, the interconnects 114, 116, 118, and 120 are not necessarily around the bar type via structure 138. The intersection of the interconnects 114, 116, 118, and 120 defines a rectangular enclosure 146. Due to fabrication constraints/design rule limitations, interconnects that are not part of the bar type via structure 138 must be outside the enclosure 146. The $M_x$ and $M_{x-1}$ layer interconnects 144, 140 are wider than each of the tracks (tracks are locations along which $M_2$ layer and higher layer interconnects may be routed), such as the vertical tracks 102-112 (shown on the $M_x$ layer; all of which have approximately the same width) that extend in the first direction, and the horizontal tracks 122-136 (shown on the $M_{x-1}$ layer; all of which have approximately the same width) that extend in the second direction. The via 142 has a width 14) greater than a width of each of the tracks 102-112, and has a length l greater than a width of each of the tracks 122-136. By comparing the tracks to the enclosure 146, it can be determined that the bar type via structure 138 blocks three vertical tracks 106, 108, 110, and four horizontal tracks 126, 128, 130, and 132. As such, none of the vertical tracks 106, 108, 110 and the horizontal tracks 126, 128, 130, 132 may be utilized within the enclosure 146 of the bar type via structure 138. This is because if metal wires on vertical tracks 106, 108, or 110 were to extend within enclosure 146, such metal wires would be too close to interconnect 144 and would violate design rules/fabrication constraints. Similarly, if metal wires on horizontal tracks 126, 128, 130, or 132 were to extend within enclosure 146, such metal wires would be too close to interconnect 140 and would violate design rules/fabrication constraints.

Figure 1B:
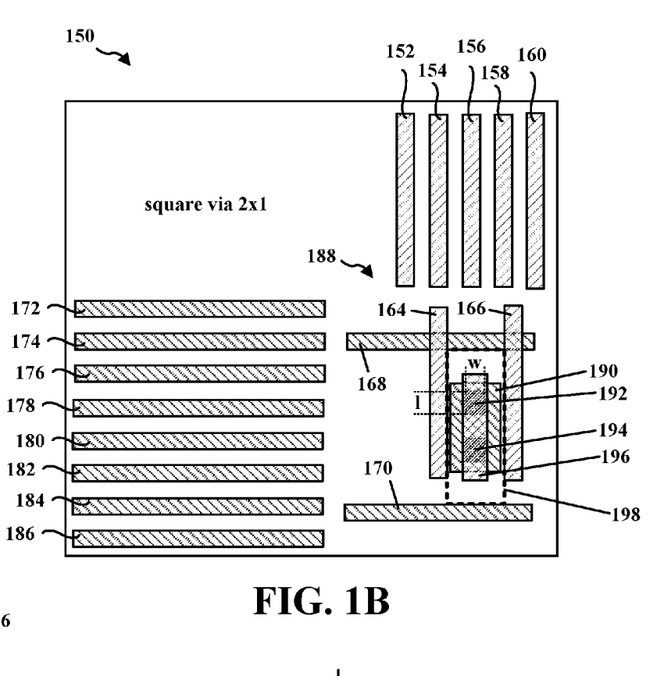
FIG. 1B is a diagram illustrating a top view of a square type via structure.

FIG. 1B is a diagram 150 illustrating a square type via structure 188. The square type via structure 188 is a 2×1 via stack (including two square vias) that may be used to provide power (e.g., $V_{dd}$)/ground (e.g., $V_{ss}$) to lower metal layers. The square type via structure 188 includes an $M_x$ layer interconnect 196, an $M_{x-1}$ layer interconnect 190, and vias 192 and 194 connecting the $M_x$ layer interconnect 196 to the $M_{x-1}$ layer interconnect 190. The $M_x$ layer interconnect 196 extends in the first direction, and the $M_{x-1}$ layer interconnect 190 extends in the second direction orthogonal to the first direction. The pattern of interconnects and vias may repeat until the via stack reaches the lower metal layers. The $M_x$ layer interconnects 164 and 166 and the $M_{x-1}$ layer interconnects 168 and 170 are shown merely to help illustrate the boundaries of the square type via structure 188, and are not part of the square type via structure 188. Further, the interconnects 164, 166, 168, and 170 are not necessarily around the square type via structure 188. The intersection of the interconnects 164, 166, 168, and 170 defines a rectangular enclosure 198. Due to fabrication constraints/design rule limitations, interconnects that are not part of the square type via structure 188 must be outside the enclosure 198. The $M_x$ and $M_{x-1}$ layer interconnects 196, 190 are wider than each of the tracks, such as the vertical tracks 152-160 (shown on the $M_x$ layer; all of which have approximately the same width) that extend in the first direction, and the horizontal tracks 172-186 (shown on the $M_{x-1}$ layer; all of which have approximately the same width) that extend in the second direction. The vias 192, 194 each have a width w greater than a width of each of the tracks 102-112, and has a length l greater than a width of each of the tracks 122-136. By comparing the tracks to the enclosure 198, it can be determined that the square type via structure 188 blocks two vertical tracks 156 and 158, and five horizontal tracks 176, 178, 180, 182, and 184. As such, none of the vertical tracks 156, 158 and the horizontal tracks 176, 178, 180, 182, 184 may be utilized within the enclosure 198 of the square type via structure 188. This is because if metal wires on vertical tracks 156 or 158 were to extend within enclosure 198, such metal wires would be too close to interconnect 196 and would violate design rules/fabrication constraints. Similarly, if metal wires on horizontal tracks 176, 178, 180, 182, or 184 were to extend within enclosure 198, such metal wires would be too close to interconnect 190 and would violate design rules/fabrication constraints.

Figure 2:
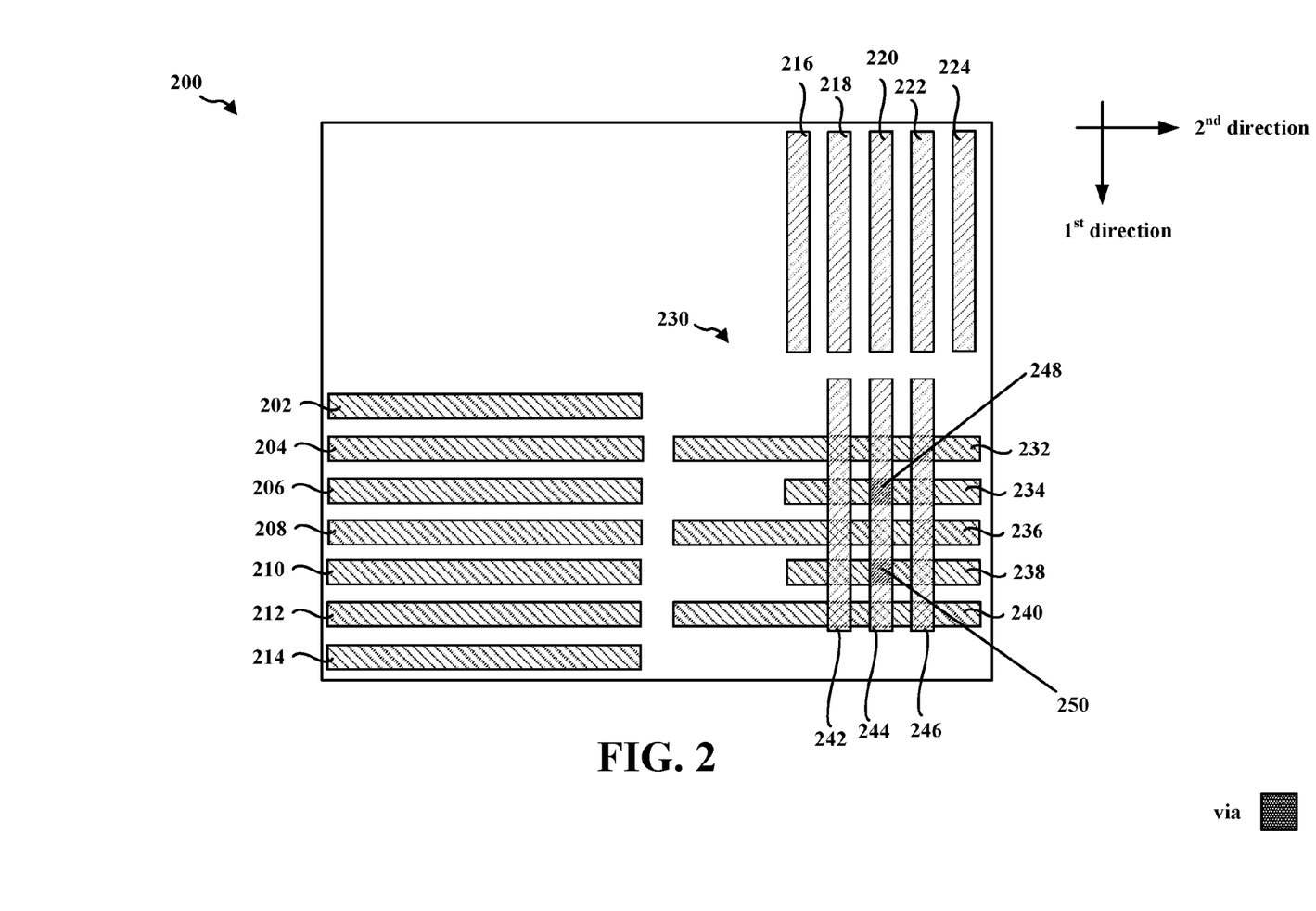
FIG. 2 is a diagram illustrating a top view of a first exemplary via structure.

FIG. 2 is a diagram 200 illustrating a first exemplary via structure 230. The via structure 230 is formed on the vertical track 220 of the vertical tracks 216-224, and on the horizontal tracks 206 and 210 of the horizontal tracks 202-214. The via structure 230 includes an $M_x$ layer interconnect 244 that extends on the track 220, an $M_{x-1}$ layer interconnect 234 that extends on the track 206, an $M_{x-1}$ layer interconnect 238 that extends on the track 210, a via 248 connecting the $M_x$ layer interconnect 244 to the $M_{x-1}$ layer interconnect 234, and a via 250 connecting the $M_x$ layer interconnect 244 to the $M_{x-1}$ layer interconnect 238. The $M_x$ layer interconnect 244 extends in the first direction, and the $M_{x-1}$ layer interconnects 234 and 238 extend in the second direction orthogonal to the first direction. The vias 248 and 250 are each within an overlapping portion of corresponding tracks. As shown in FIG. 2, the via 248 is within an overlapping portion of the track 220 and the track 206, and the via 250 is within an overlapping portion of the track 220 and the track 210. The vias 248 and 250 are separated by one track, as the track 208 is an intervening track of the tracks 206 and 210. In one configuration, the vias 248 and 250 are separated by exactly one track. In another configuration, the vias 248 and 250 are separated by two or more tracks. Assuming the $M_{x-1}$ layer interconnects 234 and 238 have a minimum width according to the design rules for the particular manufacturing process technology, the $M_{x-1}$ layer interconnects 234 and 238 may extend across a width of at least three vertical tracks in order to maintain minimum area constraints imposed by the design rules. Specifically, the widths of the $M_{x-1}$ interconnects 234 and 238 may be a width of a horizontal track, and the lengths of the $M_{x-1}$ interconnects 234 and 238 may be selected to meet a minimum area requirement imposed by the design rules for the particular manufacturing process technology. In FIG. 2, the $M_{x-1}$ layer interconnects 234 and 238 each extend across the vertical tracks 218, 220, and 222. The pattern of interconnects and vias may repeat until the via stack reaches the lower metal layers.

As shown in FIG. 2, the via structure 230 blocks two horizontal tracks of $M_{x-1}$ (i.e., horizontal tracks 206 and 210), and one vertical track of $M_x$ (i.e., vertical track 220). Interconnects 242, 246, 232, 236, and 240 help to illustrate permissible spacings of interconnects from the via structure 230. Such interconnects 242, 246, 232, 236, and/or 240 may or may not be adjacent the via structure 230. Interconnects such as the interconnects 242, 246, 232, 236, and/or 240 may extend adjacent (e.g., interconnects 242, 246, 232, 240) or through (e.g., interconnect 236) the via structure 230. When one or more of such interconnects 242, 246, 232, 236, and/or 240 extend adjacent/through the via structure 230, the one or more interconnects may be uncoupled to each other and to the via structure 230 and may carry different signals. For example, the interconnects 242 and 246 may extend adjacent the via structure 230 and may be uncoupled to each other and to the via structure 230. For another example, the interconnect 236 may extend through the via structure 230 (between the via stack at 248 and the via stack at 250) and may be uncoupled to the via structure 230. For yet another example, the interconnects 232 and 240 may extend adjacent the via structure 230 and may be uncoupled to each other, uncoupled to the via structure 230, and uncoupled to other interconnects such as the interconnects 242, 246, and 236.

The interconnects 244, 234, and 238 may be unconnected to other interconnects on the same metal layer. For example, the interconnect 244 may be uncoupled to any other interconnect on the same metal layer as the interconnect 244. As such, the interconnect 244 may be connected only to the vias 248 and 250, and to any other vias above the interconnect 244 for providing power or ground to the interconnect 244. For another example, the interconnects 234 and 238 may each be unconnected to any other interconnect on the same metal layer as the interconnects 234 and 238. As such, the interconnect 234 may be connected only to the via 248 and to the via below the interconnect 234, and may be coupled (through vias) only to the interconnect 238 on the same metal layer. Further, the interconnect 238 may be connected only to the via 250 and to the via below the interconnect 238, and may be coupled (through vias) only to the interconnect 234 on the same metal layer.

The via structure 230 has approximately the same PG strength as compared to the via structures of FIGS. 1A, 1B, but a higher signal porosity/routability because via structure 230 blocks fewer tracks than via structures 138 and 188. As such, use of the via structure 230 maintains a PG strength as compared to the via structures of FIGS. 1A, 1B, while improving a signal porosity/routability. Improved signal porosity/routability allows for more compact routing, and as a result, a smaller die size.

Figure 3A:
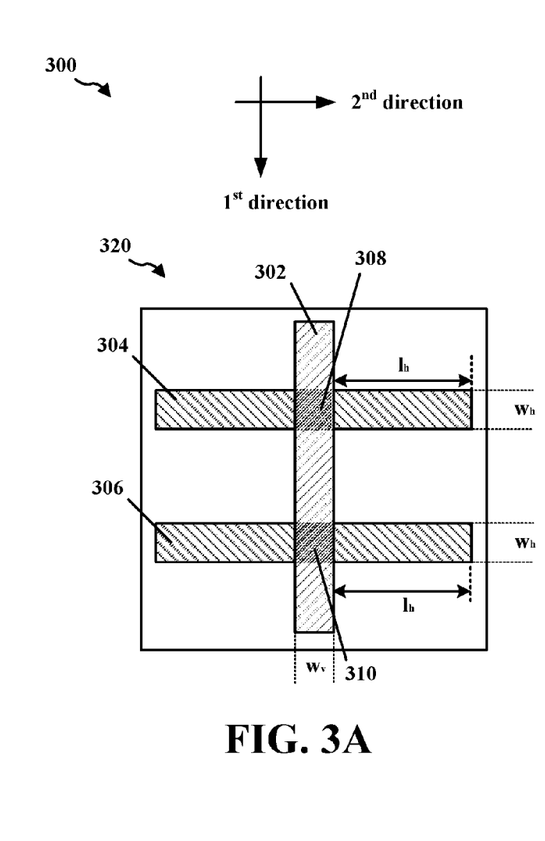
FIG. 3A is a diagram illustrating a top view of the first exemplary via structure.
Figure 3B:
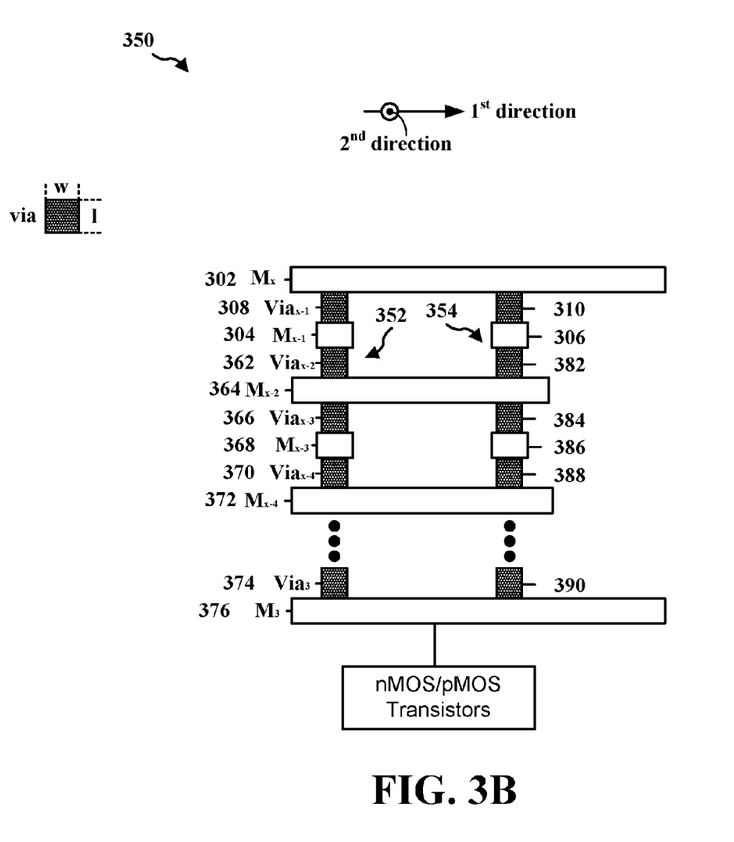
FIG. 3B is a diagram illustrating a side view of the first exemplary via structure.

FIG. 3A is a diagram 300 illustrating the first exemplary via structure 320. FIG. 3B is a diagram 350 illustrating a side perspective of the first exemplary via structure 320. The diagram 350 is a side perspective of the via structure 320 from the second direction. The via structure 320 corresponds with the via structure 230 of FIG. 2. The via structure 320 includes an $M_x$ layer interconnect 302, an $M_{x-1}$ layer interconnect 304, an $M_{x-1}$ layer interconnect 306, a via 308 connecting the $M_x$ layer interconnect 302 to the $M_{x-1}$ layer interconnect 304, and a via 310 connecting the $M_x$ layer interconnect 302 to the $M_{x-1}$ layer interconnect 306. The $M_x$ layer interconnect 302 extends in the first direction, and the $M_{x-1}$ layer interconnects 304 and 306 extend in the second direction orthogonal to the first direction. The vias 308 and 310 are each within an overlapping portion of corresponding tracks. A length l of each of the vias 308 and 310 is less than or equal to a width $w_h$ of the $M_{x-1}$ layer interconnects 304 and 306, and a width w of each of the vias 308 and 310 is less than or equal to a width $w_v$ of the $M_x$ layer interconnect 302. The vias 308 and 310 are separated by one track (see FIG. 2). The $M_{x-1}$ layer interconnects 304 and 306 may extend across a width of at least three vertical tracks (see FIG. 2). In particular, the $M_{x-1}$ layer interconnects 304 and 306 may extend past the vias 308 and 310 (indicated by $l_h$), respectively, by at least three via widths w. As such, $l_h \geq 3w$.

The pattern of interconnects and vias may repeat until the via stack structure reaches a lower metal layer. For example, referring to FIG. 3B, the via structure 320 includes a first via stack 352 and a second via stack 354. The first via stack 352 further includes $via_{x-2}$ 362, $M_{x-2}$ layer interconnect 364, $via_{x-3}$ 366, $M_{x-3}$ layer interconnect 368, $via_{x-4}$ 370, $M_{x-4}$ layer interconnect 372, and so forth, until reaching $via_{x-3}$ 374 and $M_3$ layer interconnect 376. The second via stack 354 further includes $via_{x-2}$ 382, $M_{x-2}$ layer interconnect 364, $via_{x-3}$ 384, $M_{x-3}$ layer interconnect 386, $via_{x-4}$ 388, $M_{x-4}$ layer interconnect 372, and so forth, until reaching $via_{x-3}$ 390 and $M_3$ layer interconnect 376. The $M_{x-3}$ layer interconnects 368 and 386 may also extend across a width of at least three vertical tracks (see FIG. 2). In particular, the $M_{x-3}$ layer interconnect 368 may extend past the vias $via_{x-3}$ 366 and $via_{x-4}$ 370 (indicated by $l_h$) by at least three via widths w, and the $M_{x-3}$ layer interconnect 386 may extend past the vias $via_{x-3}$ 384 and $via_{x-4}$ 388 (indicated by $l_h$) by at least three via widths w. The via structure 320 provides power (e.g., $V_{dd}$)/ground (e.g., $V_{ss}$) from the $M_x$ layer interconnect 302 to the $M_3$ layer interconnect 376. In one example, the $M_x$ layer may be an $M_9$ layer. The power/ground at the $M_3$ layer interconnect 376 is provided to metal oxide semiconductor (MOS) (e.g., n-type MOS (nMOS), p-type MOS (pMOS)) transistors located below the $M_3$ layer interconnect 376. As such, the $M_3$ layer interconnect 376 is coupled to a source of at least one of the MOS transistors located below the $M_3$ layer interconnect 376.

As discussed in relation to FIG. 2, the via structure 320 blocks two horizontal tracks, and one vertical track. The via structure 320 has approximately the same PG strength as compared to the via structures of FIGS. 1A, 1B, but a higher signal porosity/routability. As such, use of the via structure 320 maintains a PG strength as compared to the via structures of FIGS. 1A, 1B, while improving a signal porosity/routability. Improved signal porosity/routability allows for more compact routing, and as a result, a smaller die size.

Figure 4:
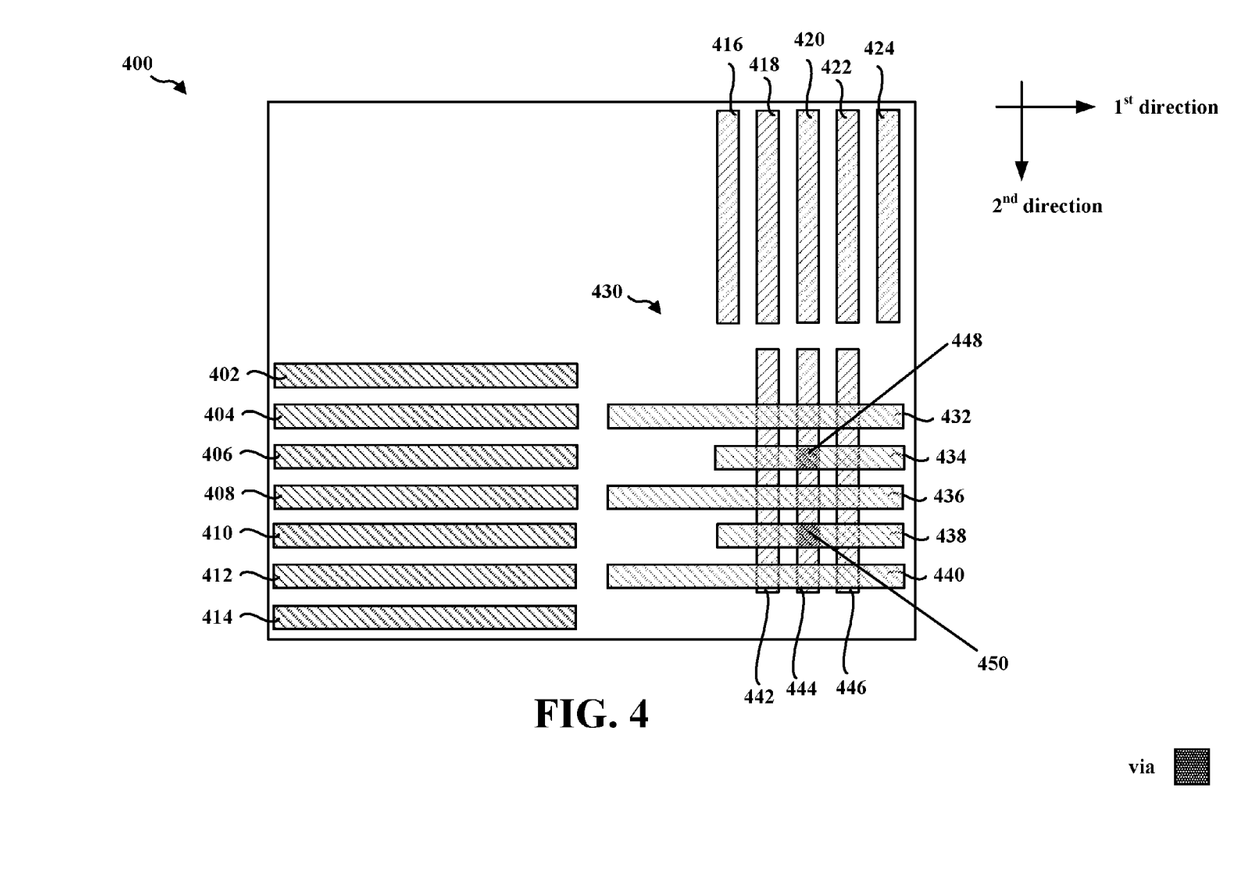
FIG. 4 is a diagram illustrating a top view of a second exemplary via structure.

FIG. 4 is a diagram 400 illustrating a top view of a second exemplary via structure 430. The via structure 430 is formed on the vertical track 420 of the vertical tracks 416-424, and on the horizontal tracks 406 and 410 of the horizontal tracks 402-414. The via structure 430 includes an $M_x$ layer interconnect 434 that extends on the track 406, an $M_x$ layer interconnect 438 that extends on the track 410, an $M_{x-1}$ layer interconnect 444 that extends on the track 420, a via 448 connecting the $M_x$ layer interconnect 434 to the $M_{x-1}$ layer interconnect 444, and a via 450 connecting the $M_x$ layer interconnect 438 to the $M_{x-1}$ layer interconnect 444. The $M_x$ layer interconnects 434 and 438 extend in the first direction, and the $M_{x-1}$ layer interconnect 444 extends in the second direction orthogonal to the first direction. The vias 448 and 450 are each within an overlapping portion of corresponding tracks. As shown in FIG. 4, the via 448 is within an overlapping portion of the track 420 and the track 406, and the via 450 is within an overlapping portion of the track 420 and the track 410. The vias 448 and 450 are separated by one track, as the track 408 is an intervening track of the tracks 406 and 410. In one configuration, the vias 448 and 450 are separated by exactly one track. In another configuration, the vias 448 and 450 are separated by two or more tracks. Assuming the $M_x$ layer interconnects 434 and 438 have a minimum width according to the design rules for the particular manufacturing process technology, the $M_x$ layer interconnects 434 and 438 may extend across a width of at least three vertical tracks in order to maintain minimum area constraints imposed by the design rules. Specifically, the widths of the $M_x$ interconnects 434 and 438 may be a width of a horizontal track, and the lengths of the $M_x$ interconnects 434 and 438 may be selected to meet a minimum area requirement imposed by the design rules for the particular manufacturing process technology. In FIG. 4, the $M_x$ layer interconnects 434 and 438 each extend across the vertical tracks 418, 420, and 422. The pattern of interconnects and vias may repeat until the via stack reaches the lower metal layers.

As shown in FIG. 4, the via structure 430 blocks two horizontal tracks of $M_x$ (i.e., horizontal tracks 406 and 410), and one vertical track of $M_{x-1}$ (i.e., vertical track 420). Interconnects 442, 446, 432, 436, and 440 help to illustrate permissible spacings of interconnects from the via structure 430. Such interconnects 442, 446, 432, 436, and/or 440 may or may not be adjacent the via structure 430. Interconnects such as the interconnects 442, 446, 432, 436, and/or 440 may extend adjacent (e.g., interconnects 442, 446, 432, 440) or through (e.g., interconnect 436) the via structure 430. When one or more of such interconnects 442, 446, 432, 436, and/or 440 extend adjacent/through the via structure 430, the one or more interconnects may be uncoupled to each other and to the via structure 430 and may carry different signals. For example, the interconnects 442 and 446 may extend adjacent the via structure 430 and may be uncoupled to each other and to the via structure 430. For another example, the interconnect 436 may extend through the via structure 430 (between the via stack at 448 and the via stack at 450) and may be uncoupled to the via structure 430. For yet another example, the interconnects 432 and 440 may extend adjacent the via structure 430 and may be uncoupled to each other, uncoupled to the via structure 430, and uncoupled to other interconnects such as the interconnects 442, 446, and 436.

The interconnects 444, 434, and 438 may be uncoupled to other interconnects on the same metal layer. For example, the interconnect 444 may be uncoupled to any other interconnect on the same metal layer as the interconnect 444. As such, the interconnect 444 may be connected only to the vias 448 and 450, and to vias below the interconnect 444. For another example, the interconnects 434 and 438 may each be uncoupled to any other interconnect on the same metal layer as the interconnects 434 and 438. As such, the interconnect 434 may be connected only to the via 448 and to the via above the interconnect 434 for providing power/ground to the interconnect 434, and may be coupled (through vias) only to the interconnect 438 on the same metal layer. In addition, the interconnect 438 may be connected only to the via 250 and to the via above the interconnect 438 for providing power/ground to the interconnect 438, and may be coupled (through vias) only to the interconnect 434 on the same metal layer.

The via structure 430 has approximately the same PG strength as compared to the via structures of FIGS. 1A, 1B, but a higher signal porosity/routability because via structure 430 blocks fewer tracks than via structures 138 and 188. As such, use of the via structure 430 maintains a PG strength as compared to the via structures of FIGS. 1A, 1B, while improving a signal porosity/routability. Improved signal porosity/routability allows for more compact routing, and as a result, a smaller die size.

Figure 5A:
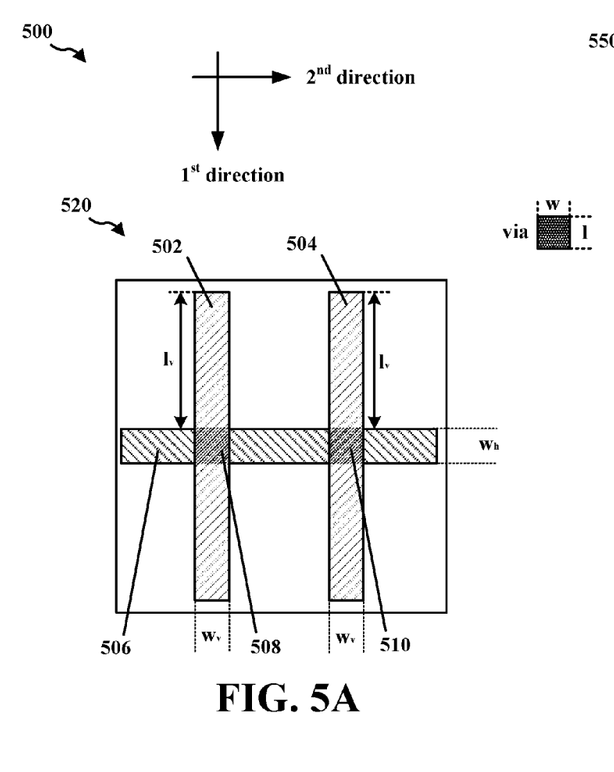
FIG. 5A is a diagram illustrating a top view of the second exemplary via structure.
Figure 5B:
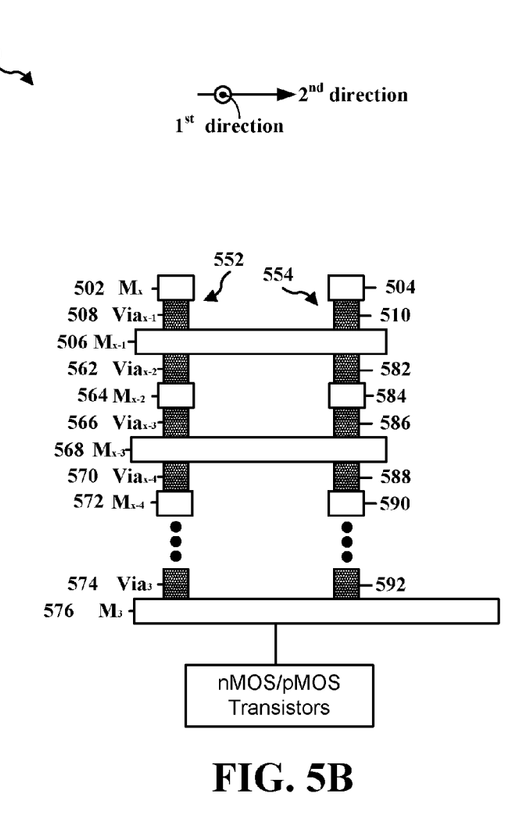
FIG. 5B is a diagram illustrating a side view of the second exemplary via structure.

FIG. 5A is a diagram 500 illustrating a second exemplary via structure 520. FIG. 5B is a diagram 550 illustrating a side perspective of the second exemplary via structure 520. The diagram 550 is a side perspective of the via structure 520 from the first direction. The via structure 520 includes an $M_x$ layer interconnect 502, an $M_x$ layer interconnect 504, an $M_{x-1}$ layer interconnect 506, a via 508 connecting the $M_x$ layer interconnect 502 to the $M_{x-1}$ layer interconnect 506, and a via 510 connecting the $M_x$ layer interconnect 504 to the $M_{x-1}$ layer interconnect 506. The $M_x$ layer interconnects 502 and 504 extend in the first direction, and the $M_{x-1}$ layer interconnect 506 extends in the second direction orthogonal to the first direction. The vias 508 and 510 are each within an overlapping portion of corresponding tracks. A length l of each of the vias 508 and 510 is less than or equal to a width $w_h$ of the $M_{x-1}$ layer interconnect 506, and a width w of each of the vias 508 and 510 is less than or equal to a width $w_v$ of the $M_x$ layer interconnects 502 and 504. The vias 508 and 510 are separated by one track. The $M_x$ layer interconnects 502 and 504 may extend across a width of at least three horizontal tracks. In particular, the $M_x$ layer interconnects 502 and 504 may extend past the vias 508 and 510 (indicated by $l_v$), respectively, by at least three via widths w. As such, $l_v \geq 3w$.

The pattern of interconnects and vias may repeat until the via stack structure reaches a lower metal layer. For example, referring to FIG. 5B, the via structure 520 includes a first via stack 552 and a second via stack 554. The first via stack 552 further includes $via_{x-2}$ 562, $M_{x-2}$ layer interconnect 564, $via_{x-3}$ 566, $M_{x-3}$ layer interconnect 568, $via_{x-4}$ 570, $M_{x-4}$ layer interconnect 572, and so forth, until reaching $via_{x-3}$ 574 and $M_3$ layer interconnect 576. The second via stack 554 further includes $via_{x-2}$ 582, $M_{x-2}$ layer interconnect 584, $via_{x-3}$ 386, $M_{x-3}$ layer interconnect 568, via$_{x-4}$ 588, $M_{x-4}$ layer interconnect 590, and so forth, until reaching via$_{x-3}$ 592 and $M_3$ layer interconnect 576. The $M_{x-2}/M_{x-4}$ layer interconnects 564, 584, 572, 590 may each extend across a width of at least three horizontal tracks. In particular, the $M_{x-2}/M_{x-4}$ layer interconnects 564, 584, 572, 590 may extend past the connected vias (indicated by $l_v$) by at least three via widths w. The via structure 520 provides power (e.g., $V_{dd}$)/ground (e.g., $V_{ss}$) from the $M_x$ layer interconnects 502 and 504 to the $M_3$ layer interconnect 576. In one example, the $M_x$ layer may be an $M_9$ layer. The power/ground at the $M_3$ layer interconnect 576 is provided to MOS (e.g., nMOS, pMOS) transistors located below the $M_3$ layer interconnect 576. As such, the $M_3$ layer interconnect 576 is coupled to a source of at least one of the MOS transistors located below the $M_3$ layer interconnect 576.

Similar to the via structure 320 of FIGS. 3A, 3B, the via structure 520 blocks three tracks. Specifically, the via structure 520 blocks two vertical tracks and one horizontal track. The via structure 520 blocks more vertical tracks than the via structure 320, and less horizontal tracks than the via structure 320. Accordingly, the via structure 520 may be used when more horizontal signal routing tracks are desired, and the via structure 320 may be used when more vertical signal routing tracks are desired. The via structures 320, 520 have the same PG strength. The via structure 520 has approximately the same PG strength as compared to the via structures of FIGS. 1A, 1B, but a higher signal porosity/routability. As such, use of the via structure 520 maintains a PG strength as compared to the via structures of FIGS. 1A, 1B, while improving a signal porosity/routability. Improved signal porosity/routability allows for more compact routing, and as a result, a smaller die size.

Figure 6:
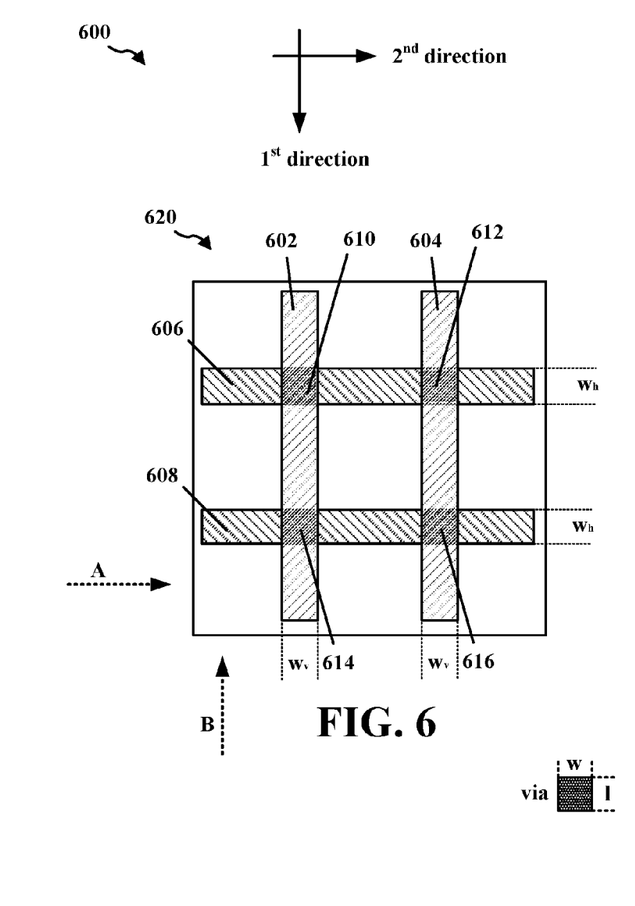
FIG. 6 is a diagram illustrating a top view of a third exemplary via structure.

FIG. 6 is a diagram 600 illustrating a third exemplary via structure 620. The via structure 620 includes an $M_x$ layer interconnect 602, an $M_x$ layer interconnect 604, an $M_{x-1}$ layer interconnect 606, an $M_{x-1}$ layer interconnect 608, a via 610 connecting the $M_x$ layer interconnect 602 to the $M_{x-1}$ layer interconnect 606, a via 612 connecting the $M_x$ layer interconnect 604 to the $M_{x-1}$ layer interconnect 606, a via 614 connecting the $M_x$ layer interconnect 602 to the $M_{x-1}$ layer interconnect 608, and a via 616 connecting the $M_x$ layer interconnect 604 to the $M_{x-1}$ layer interconnect 608. The $M_x$ layer interconnects 602 and 604 extend in the first direction, and the $M_{x-1}$ layer interconnects 606 and 608 extend in the second direction orthogonal to the first direction. The vias 610, 612, 614, and 616 are each within an overlapping portion of corresponding tracks. A length l of each of the vias 610, 612, 614, and 616 is less than or equal to a width $w_h$ of the $M_{x-1}$ layer interconnects 606 and 608, and a width w of each of the vias 610, 612, 614, and 616 is less than or equal to a width $w_v$ of the $M_x$ layer interconnects 602 and 604. The vias 610 and 612 and the vias 614 and 616 are separated by one track (similar to the via structure 520 of FIGS. 5A, 5B), and the vias 610 and 614 and the vias 612 and 616 are separated by one track (similar to the via structure 320 of FIGS. 3A, 3B). The $M_x$ layer interconnects 602 and 604 may each extend across a width of at least three horizontal tracks, and the $M_{x-1}$ layer interconnects 606 and 608 may each extend across a width of at least three vertical tracks.

The pattern of interconnects and vias may repeat until the via stack structure reaches a lower metal layer. The via structure 620 provides power (e.g., $V_{dd}$)/ground (e.g., $V_{ss}$) from the $M_x$ layer interconnects 602 and 604 to a lower metal $M_y$ layer interconnect, where the $M_y$ layer is lower than the $M_x$ layer. A side perspective from direction A is similar to the side perspective of FIG. 3B, and a side perspective from direction B is similar to the side perspective of FIG. 5B. The via structure 620 blocks four tracks. Specifically, the via structure 620 blocks two vertical tracks and two horizontal track. The via structure 620 blocks one additional track as compared to the via structures 320 and 520, and therefore has a lower signal porosity/routability than the via structures 320 and 520. However, the via structure 620 has half of the resistance of the via structures 320 and 520, and accordingly twice the PG strength. The via structure 620 may be used for applications that require a higher PG strength.

An apparatus may include the via structure 620 and additional interconnects similar to those illustrated in FIGS. 2, 4. For example, a first interconnect may extend through the via structure 620 such that the first interconnect is between the interconnects 602, 604. The first interconnect may be uncoupled to the via structure 620. For another example, a second interconnect may extend through the via structure 620 such that the second interconnect is between the interconnects 606, 608. The second interconnect may be uncoupled to the via structure 620. Such apparatus may include the via structure 620 and at least one of the first and second interconnects. Each of the interconnects 602, 604, 606, 608 may be uncoupled to interconnects outside the via structure 620 on the same metal layer. For example, the interconnect 602, while coupled (through vias) to the interconnect 604 on the same metal layer, may be uncoupled to any other interconnect on the same metal layer except for the interconnect 604. For another example, the interconnect 606, while coupled (through vias) to the interconnect 608 on the same metal layer, may be uncoupled to any other interconnect on the same metal layer except for the interconnect 608. Further, each of the interconnects 602, 604, 606, 608 may be uncoupled to vias outside the via structure 620, with the exception of vias that couple to the interconnects 602 and 604 to provide power/ground to the interconnects 602 and 604. The highest layer interconnects may be on an $M_9$ layer and the lowest layer interconnects may be on an $M_3$ layer. The power/ground at the $M_3$ layer interconnects may be provided to MOS (e.g., nMOS, pMOS) transistors located below the $M_3$ layer interconnects. As such, the $M_3$ layer interconnects may be coupled to a source of at least one of the MOS transistors located below the $M_3$ layer interconnects.

Referring again to FIGS. 2, 3A, 3B, an apparatus 230, which includes a conductive stack structure 320, includes an $M_x$ layer interconnect 302/244 on an $M_x$ layer and extending in a first direction on a first track, and a metal $M_y$ layer interconnect 376 on an $M_y$ layer. The $M_y$ layer (e.g., $M_3$ layer) is a lower layer than the $M_x$ layer. The apparatus 230 further includes a first via stack 352 coupled between the $M_x$ layer interconnect 302/244 and the $M_y$ layer interconnect 376. The first via stack 352 includes a first $M_{x-1}$ layer interconnect 304/234 on an $M_{x-1}$ layer and includes a plurality of vias. The first $M_{x-1}$ layer interconnect 304/234 is a higher layer than the $M_y$ layer interconnect. The first $M_{x-1}$ layer interconnect 304/234 extends in a second direction on a second track. The second direction is orthogonal to the first direction. The plurality of vias include a first via 308/248 connected to the $M_x$ layer interconnect 302/244 and the first $M_{x-1}$ layer interconnect 304/234 within an overlapping portion of the first track and the second track. The plurality of vias include a second via (any one of the vias 374, 370, 366, or 362) coupled between the $M_y$ layer interconnect 376 and the first $M_{x-1}$ layer interconnect 304/234. The second via (any one of the vias 374, 370, 366, or 362) is within an overlapping portion of the first track and the second track. The apparatus 230 further includes a second via stack 354 coupled between the $M_x$ layer interconnect 302/244 and the $M_y$ layer interconnect 376. The second via stack 354 includes a second $M_{x-1}$ layer interconnect 306/238 and a second plurality of vias. The second $M_{x-1}$ layer interconnect 306/238 extends in the second direction on a third track. The second plurality of vias include a third via 310/250 connected to the $M_x$ layer interconnect 302/244 and the second $M_{x-1}$ layer interconnect 306/238 within an overlapping portion of the first track and the third track. The second plurality of vias include a fourth via (any one of the vias 390, 388, 384, or 382) coupled between the $M_y$ layer interconnect 376 and the second $M_{x-1}$ layer interconnect 306/238. The fourth via (any one of the vias 390, 388, 384, or 382) is within an overlapping portion of the first track and the third track. The apparatus 230 further includes a second $M_x$ layer interconnect 242 extending in the first direction on a fourth track immediately adjacent to the first track. The apparatus 230 further includes a third $M_x$ layer interconnect 246 extending in the first direction on a fifth track immediately adjacent to the first track. The $M_x$ layer interconnect 244 is between the second $M_x$ layer interconnect 242 and the third $M_x$ layer interconnect 246. The second $M_x$ layer interconnect 242 and the third $M_x$ layer interconnect 246 are uncoupled to each other.

In one configuration, the first via 308/248 and the second via (any one of the vias 374, 370, 366, or 362) each have a width of approximately w, and the first $M_{x-1}$ layer interconnect 304/234 extends past the first via 308/248 and the second via (any one of the vias 374, 370, 366, or 362) by at least a length 3w. In addition, the third via 310/250 and the fourth via (any one of the vias 390, 388, 384, or 382) each have a width of approximately w, and the second $M_{x-1}$ layer interconnect 306/238 extends past the third via 310/250 and the fourth via (any one of the vias 390, 388, 384, or 382) by at least a length 3w. In one configuration, the apparatus 230 further includes a third $M_{x-1}$ layer interconnect 236 extending in the second direction between the first $M_{x-1}$ layer interconnect 304/234 and the second $M_{x-1}$ layer interconnect 306/238. The third $M_{x-1}$ layer interconnect 236 is uncoupled to the first $M_{x-1}$ layer interconnect 304/234 and the second $M_{x-1}$ layer interconnect 306/238.

In one configuration, the $M_x$ layer interconnect 302/244 is uncoupled to any interconnect on the $M_x$ layer. In one configuration, the first $M_{x-1}$ layer interconnect 304/234 is uncoupled to any interconnect on the $M_{x-1}$ layer other than the second $M_{x-1}$ layer interconnect 306/238. In one configuration, the first $M_{x-1}$ layer interconnect 304/234 is uncoupled to any via between the $M_x$ layer and the $M_{x-1}$ layer except for the first via 308/248. In one configuration, the second $M_{x-1}$ layer interconnect 306/238 is uncoupled to any interconnect on the $M_{x-1}$ layer other than the first $M_{x-1}$ layer interconnect 304/234. In one configuration, the second $M_{x-1}$ layer interconnect 306/238 is uncoupled to any via between the $M_x$ layer and the $M_{x-1}$ layer except for the third via 310/250. In one configuration, the $M_y$ layer is an $M_3$ layer. In one configuration, the apparatus 230 includes a plurality of MOS transistors located below the $M_y$ layer interconnect. The $M_y$ layer interconnect is coupled to a source of at least one of the MOS transistors.

Similar to the structure shown in FIG. 2, the first and third vias 308/248, 310/250 are separated by at least one track, and the second and fourth vias are separated by at least one track. In one configuration, the first and third vias 308/248, 310/250, respectively, are separated by exactly one track (with one intervening track), and the second and fourth vias are separated by exactly one track (with one intervening track). Similar to the structure shown in FIG. 2, the first $M_{x-1}$ layer interconnect 304/234 extends across at least three tracks. The first and second via stacks 352, 354 may provide power (e.g., $V_{dd}$) or ground (e.g., $V_{ss}$) (generally, may provide a voltage) from the $M_x$ layer interconnect 302/244 to the $M_y$ layer interconnect 376.

Referring again to FIG. 6, a conductive stack structure apparatus 620 includes an $M_x$ layer interconnect 602 extending in a first direction on a first track and a metal $M_y$ layer interconnect (see FIGS. 3B, 5B, as the side perspective of FIG. 6 from direction A is similar to FIG. 3B and the side perspective of FIG. 6 from direction B is similar to FIG. 5B). The $M_y$ layer (e.g., $M_3$ layer) is a lower layer than the $M_x$ layer. The conductive stack structure apparatus 620 further includes a first via stack (at 610) coupled between the $M_x$ layer interconnect 602 and the $M_y$ layer interconnect. The first via stack includes a first $M_{x-1}$ layer interconnect 606 and a plurality of vias. The first $M_{x-1}$ layer interconnect 606 is a higher layer than the $M_y$ layer interconnect. The first $M_{x-1}$ layer interconnect 606 extends in a second direction on a second track. The second direction is orthogonal to the first direction. The plurality of vias include a first via 610 connected to the $M_x$ layer interconnect 602 and the first $M_{x-1}$ layer interconnect 606 within an overlapping portion of the first track and the second track. The plurality of vias include a second via coupled between the $M_y$ layer interconnect and the first $M_{x-1}$ layer interconnect 606. The second via is within an overlapping portion of the first track and the second track. The conductive stack structure apparatus 620 further includes a second via stack (at 614) coupled between the $M_x$ layer interconnect 602 and the $M_y$ layer interconnect. The second via stack includes a second $M_{x-1}$ layer interconnect 608 and a second plurality of vias. The second $M_{x-1}$ layer interconnect 608 extends in the second direction on a third track. The second plurality of vias include a third via 614 connected to the $M_x$ layer interconnect 602 and the second $M_{x-1}$ layer interconnect 608 within an overlapping portion of the first track and the third track. The second plurality of vias include a fourth via coupled between the $M_y$ layer interconnect and the second $M_{x-1}$ layer interconnect 608. The fourth via is within an overlapping portion of the first track and the third track.

The conductive stack structure apparatus 620 further includes a second $M_x$ layer interconnect 604 extending in the first direction on a fourth track. The conductive stack structure apparatus 620 further includes a third via stack (at 612) coupled between the second $M_x$ layer interconnect 604 and the $M_y$ layer interconnect. The third via stack includes the first $M_{x-1}$ layer interconnect 606 and a third plurality of vias. The third plurality of vias include a fifth via 612 connected to the second $M_x$ layer interconnect 604 and the first $M_{x-1}$ layer interconnect 606 within an overlapping portion of the fourth track and the second track. The third plurality of vias include a sixth via coupled between the $M_y$ layer interconnect and the first $M_{x-1}$ layer interconnect 606. The sixth via is within an overlapping portion of the fourth track and the second track. The conductive stack structure apparatus 620 further includes a fourth via stack (at 616) coupled between the second $M_x$ layer interconnect 604 and the $M_y$ layer interconnect. The fourth via stack includes the second $M_{x-1}$ layer interconnect 608 and a fourth plurality of vias. The fourth plurality of vias include a seventh via 616 connected to the second $M_x$ layer interconnect 604 and the second $M_{x-1}$ layer interconnect 608 within an overlapping portion of the fourth track and the third track. The fourth plurality of vias include an eighth via coupled between the $M_y$ layer interconnect and the second $M_{x-1}$ layer interconnect 608. The eighth via is within an overlapping portion of the fourth track and the third track.

Similar to the structure shown in FIG. 2, the first and third vias 610, 614 are separated by at least one track, the second and fourth vias are separated by at least one track, the fifth and seventh vias 612, 616 are separated by at least one track, and the sixth and eighth vias are separated by at least one track. In one configuration, the first and third vias 610, 614 are separated by exactly one track (with one intervening track), the second and fourth vias are separated by exactly one track (with one intervening track), the fifth and seventh vias 612, 616 are separated by exactly one track (with one intervening track), and the sixth and eighth vias are separated by exactly one track (with one intervening track). Similar to the structure shown in FIG. 2, the first $M_{x-1}$ layer interconnect 606 extends across at least three tracks, and the second $M_{x-1}$ layer interconnect 608 extends across at least three tracks.

Referring again to FIG. 5, an apparatus 430, which includes a conductive stack structure 520, includes a first $M_x$ layer interconnect 502/434 on an $M_x$ layer and extending in a first direction on a first track, a second $M_x$ layer interconnect 504/438 on an $M_x$ layer and extending in the first direction on a second track, and an $M_y$ layer interconnect 576 on an $M_y$ layer. The $M_y$ layer (e.g., $M_3$ layer) is a lower layer than the $M_x$ layer. The apparatus 430 further includes a first via stack 552 coupled between the first $M_x$ layer interconnect 502/434 and the $M_y$ layer interconnect 576. The first via stack 552 includes an $M_{x-1}$ layer interconnect 506/444 on an $M_{x-1}$ layer and includes a plurality of vias. The $M_{x-1}$ layer interconnect 506/444 is a higher layer than the $M_y$ layer interconnect 576. The $M_{x-1}$ layer interconnect 506/444 extends in a second direction on a third track. The second direction is orthogonal to the first direction. The plurality of vias include a first via 508/448 connected to the first $M_x$ layer interconnect 502/434 and the $M_{x-1}$ layer interconnect 506/444 within an overlapping portion of the first track and the third track. The plurality of vias include a second via (any one of the vias 574, 570, 566, or 562) coupled between the $M_y$ layer interconnect 576 and the $M_{x-1}$ layer interconnect 506/444. The second via (any one of the vias 574, 570, 566, or 562) is within an overlapping portion of the first track and the third track. The apparatus 430 further includes a second via stack 554 coupled between the second $M_x$ layer interconnect 504/438 and the $M_y$ layer interconnect 576. The second via stack 554 includes the $M_{x-1}$ layer interconnect 506/444 and a second plurality of vias. The second plurality of vias include a third via 510/450 connected to the second $M_x$ layer interconnect 504/438 and the $M_{x-1}$ layer interconnect 506/444 within an overlapping portion of the second track and the third track. The second plurality of vias include a fourth via (any one of the vias 592, 588, 586, 582) coupled between the $M_y$ layer interconnect 576 and the $M_{x-1}$ layer interconnect 506/444. The fourth via (any one of the vias 592, 588, 586, 582) is within an overlapping portion of the second track and the third track. The apparatus further includes a third $M_x$ layer interconnect 436 extending in the first direction on a fourth track immediately adjacent to the first track and the second track. The third $M_x$ layer interconnect 436 extends between the first $M_x$ layer interconnect 502/434 and the second $M_x$ layer interconnect 504/438. The third $M_x$ layer interconnect 436 is uncoupled to the first $M_x$ layer interconnect 502/434 and the second $M_x$ layer interconnect 504/438.

In one configuration, the first via 508/448 has a width of approximately w, and the first $M_x$ layer interconnect 502/434 extends past the first via 508/448 by at least a length 3w. In addition, the third via 510/450 has a width of approximately w, and the second $M_x$ layer interconnect 504/438 extends past the third via 510/450 by at least a length 3w. In one configuration, the apparatus further includes a second $M_{x-1}$ layer interconnect 442 extending in the second direction on a fifth track immediately adjacent the third track, and a third $M_{x-1}$ layer interconnect 446 extending in the second direction on a sixth track immediately adjacent the third track. The $M_{x-1}$ layer interconnect 506/444 is between the second $M_{x-1}$ layer interconnect 442 and the third $M_{x-1}$ layer interconnect 446. The $M_{x-1}$ layer interconnect 506/444 is uncoupled to the second $M_{x-1}$ layer interconnect 442 and the third $M_{x-1}$ layer interconnect 446, and the second $M_{x-1}$ layer interconnect 442 and the third $M_{x-1}$ layer interconnect 446 are uncoupled to each other. In one configuration, the first $M_x$ layer interconnect 502/434 is uncoupled to any interconnect on the $M_x$ layer other than the second $M_x$ layer interconnect 504/438, and the second $M_x$ layer interconnect 504/438 is uncoupled to any interconnect on the $M_x$ layer other than the first $M_x$ layer interconnect 502/434.

In one configuration, the $M_{x-1}$ layer interconnect 506/444 is uncoupled to any interconnect on the $M_{x-1}$ layer. In one configuration, the $M_{x-1}$ layer interconnect 506/444 is uncoupled to any via between the $M_x$ layer and the $M_{x-1}$ layer except for the first via 508/448 and the third via 510/450. In one configuration, the $M_y$ layer is an $M_3$ layer. In one configuration, the apparatus further includes a plurality of MOS transistors located below the $M_y$ layer interconnect. The $M_y$ layer interconnect 576 is coupled to a source of at least one of the MOS transistors.

The first and third vias 508/448, 510/450, respectively, are separated by at least one track, and the second and fourth vias are separated by at least one track. In one configuration, the first and third vias 508/448, 510/450 are separated by exactly one track (with one intervening track), and the second and fourth vias are separated by exactly one track (with one intervening track). The first and second $M_x$ layer interconnects 502/434, 504/438, respectively, each extend across at least three tracks. The first and second via stacks 552, 554 provide power (e.g., $V_{dd}$) or ground (e.g., $V_{ss}$) (generally, may provide a voltage) from the first and second $M_x$ layer interconnects 502/434, 504/438 to the $M_y$ layer interconnect 576.

It is understood that the specific order or hierarchy of steps in the processes disclosed is an illustration of exemplary approaches. Based upon design preferences, it is understood that the specific order or hierarchy of steps in the processes may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. The term "connected" means "directly connected." The term "coupled" means "connected" or "indirectly connected" through other elements. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

The invention claimed is:

1. An apparatus including a conductive stack structure, comprising:
   a metal x ($M_x$) layer interconnect on an $M_x$ layer and extending in a first direction on a first track;
   a metal y ($M_y$) layer interconnect on an $M_y$ layer, the $M_y$ layer being a lower layer than the $M_x$ layer;
   a first via stack coupled between the $M_x$ layer interconnect and the $M_y$ layer interconnect, the first via stack including a first metal x-1 ($M_{x-1}$) layer interconnect on an $M_{x-1}$ layer and including a plurality of vias, the first $M_{x-1}$ layer interconnect being a higher layer than the $M_y$ layer interconnect, the first $M_{x-1}$ layer interconnect extending in a second direction on a second track, the second direction being orthogonal to the first direction, the plurality of vias including a first via connected to the $M_x$ layer interconnect and the first $M_{x-1}$ layer interconnect within an overlapping portion of the first track and the second track, the plurality of vias including a second via coupled between the $M_y$ layer interconnect and the first $M_{x-1}$ layer interconnect, the second via being within an overlapping portion of the first track and the second track;
   a second via stack coupled between the $M_x$ layer interconnect and the $M_y$ layer interconnect, the second via stack including a second $M_{x-1}$ layer interconnect and a second plurality of vias, the second $M_{x-1}$ layer interconnect extending in the second direction on a third track, the second plurality of vias including a third via connected to the $M_x$ layer interconnect and the second $M_{x-1}$ layer interconnect within an overlapping portion of the first track and the third track, the second plurality of vias including a fourth via coupled between the $M_y$ layer interconnect and the second $M_{x-1}$ layer interconnect, the fourth via being within an overlapping portion of the first track and the third track;
   a second $M_x$ layer interconnect extending in the first direction on a fourth track immediately adjacent to the first track;
   a third $M_x$ layer interconnect extending in the first direction on a fifth track immediately adjacent to the first track, the $M_x$ layer interconnect being between the second $M_x$ layer interconnect and the third $M_x$ layer interconnect, the second $M_x$ layer interconnect and the third $M_x$ layer interconnect being uncoupled to each other;
   a fourth $M_x$ layer interconnect extending in the first direction on a sixth track immediately adjacent to the fourth track, the second $M_x$ layer interconnect being between the $M_x$ layer interconnect and the fourth $M_x$ layer interconnect;
   a third via stack coupled between the fourth $M_x$ layer interconnect and the $M_y$ layer interconnect, the third via stack including the first $M_{x-1}$ layer interconnect and a third plurality of vias, the third plurality of vias including a fifth via connected to the fourth $M_x$ layer interconnect and the first $M_{x-1}$ layer interconnect within an overlapping portion of the sixth track and the second track, the third plurality of vias including a sixth via coupled between the $M_y$ layer interconnect and the first $M_{x-1}$ layer interconnect, the sixth via being within an overlapping portion of the sixth track and the second track; and
   a fourth via stack coupled between the fourth $M_x$ layer interconnect and the $M_y$ layer interconnect, the fourth via stack including the second $M_{x-1}$ layer interconnect and a fourth plurality of vias, the fourth plurality of vias including a seventh via connected to the fourth $M_x$ layer interconnect and the second $M_{x-1}$ layer interconnect within an overlapping portion of the sixth track and the third track, the fourth plurality of vias including an eighth via coupled between the $M_y$ layer interconnect and the second $M_{x-1}$ layer interconnect, the eighth via being within an overlapping portion of the sixth track and the third track.

2. The apparatus of claim 1, wherein the first and third vias are separated by at least one track, the second and fourth vias are separated by at least one track, the fifth and seventh vias are separated by at least one track, and the sixth and eighth vias are separated by at least one track.

3. The apparatus of claim 2, wherein the first and third vias are separated by one track, the second and fourth vias are separated by one track, the fifth and seventh vias are separated by one track, and the sixth and eighth vias are separated by one track.

4. The apparatus of claim 1, wherein the first $M_{x-1}$ layer interconnect extends across at least three tracks, and the second $M_{x-1}$ layer interconnect extends across at least three tracks.

5. An apparatus including a conductive stack structure, comprising:
   a first metal x ($M_x$) layer interconnect on an $M_x$ layer and extending in a first direction on a first track;
   a second $M_x$ layer interconnect on the $M_x$ layer and extending in the first direction on a second track;
   a metal y ($M_y$) layer interconnect on an $M_y$ layer, the $M_y$ layer being a lower layer than the $M_x$ layer;
   a first via stack coupled between the first $M_x$ layer interconnect and the $M_y$ layer interconnect, the first via stack including a metal x-1 ($M_{x-1}$) layer interconnect on an $M_{x-1}$ layer and including a plurality of vias, the $M_{x-1}$ layer interconnect being a higher layer than the $M_y$ layer interconnect, the $M_{x-1}$ layer interconnect extending in a second direction on a third track, the second direction being orthogonal to the first direction, the plurality of vias including a first via connected to the first $M_x$ layer interconnect and the $M_{x-1}$ layer interconnect within an overlapping portion of the first track and the third track, the plurality of vias including a second via coupled between the $M_y$ layer interconnect and the $M_{x-1}$ layer interconnect, the second via being within an overlapping portion of the first track and the third track;

a second via stack coupled between the second $M_x$ layer interconnect and the $M_y$ layer interconnect, the second via stack including the $M_{x-1}$ layer interconnect and a second plurality of vias, the second plurality of vias including a third via connected to the second $M_x$ layer interconnect and the $M_{x-1}$ layer interconnect within an overlapping portion of the second track and the third track, the second plurality of vias including a fourth via coupled between the $M_y$ layer interconnect and the $M_{x-1}$ layer interconnect, the fourth via being within an overlapping portion of the second track and the third track; and a third $M_x$ layer interconnect extending in the first direction on a fourth track immediately adjacent to the first track and the second track, the third $M_x$ layer interconnect extending between the first $M_x$ layer interconnect and the second $M_x$ layer interconnect, the third $M_x$ layer interconnect being uncoupled to the first $M_x$ layer interconnect and the second $M_x$ layer interconnect.

6. The apparatus of claim 5, wherein:
the first via has a width of approximately w, and the first $M_x$ layer interconnect extends past the first via by at least a length 3w; and
the third via has a width of approximately w, and the second $M_x$ layer interconnect extends past the third via by at least a length 314).

7. The apparatus of claim 5, further comprising:
a second $M_{x-1}$ layer interconnect extending in the second direction on a fifth track immediately adjacent the third track; and
a third $M_{x-1}$ layer interconnect extending in the second direction on a sixth track immediately adjacent the third track,
wherein the $M_{x-1}$ layer interconnect is between the second $M_{x-1}$ layer interconnect and the third $M_{x-1}$ layer interconnect, the $M_{x-1}$ layer interconnect is uncoupled to the second $M_{x-1}$ layer interconnect and the third $M_{x-1}$ layer interconnect, and the second $M_{x-1}$ layer interconnect and the third $M_{x-1}$ layer interconnect are uncoupled to each other.

8. The apparatus of claim 5, wherein the first $M_x$ layer interconnect is uncoupled to any interconnect on the $M_x$ layer other than the second $M_x$ layer interconnect, and the second $M_x$ layer interconnect is uncoupled to any interconnect on the $M_x$ layer other than the first $M_x$ layer interconnect.

9. The apparatus of claim 5, wherein the $M_{x-1}$ layer interconnect is uncoupled to any interconnect on the $M_{x-1}$ layer.

10. The apparatus of claim 9, wherein the $M_{x-1}$ layer interconnect is uncoupled to any via between the $M_x$ layer and the $M_{x-1}$ layer except for the first via and the third via.

11. The apparatus of claim 5, wherein the $M_y$ layer is an $M_3$ layer.

12. The apparatus of claim 5, further comprising a plurality of metal oxide semiconductor (MOS) transistors located below the $M_y$ layer interconnect, wherein the $M_y$ layer interconnect is coupled to a source of at least one of plurality of the MOS transistors.

13. The apparatus of claim 5, wherein the first and third vias are separated by at least one track, and the second and fourth vias are separated by at least one track.

14. The apparatus of claim 13, wherein the first and third vias are separated by one track, and the second and fourth vias are separated by one track.

15. The apparatus of claim 5, wherein the first and second $M_x$ layer interconnects each extend across at least three tracks.

16. The apparatus of claim 5, wherein the first and second via stacks provide one of power or ground from the first and second $M_x$ layer interconnects to the $M_y$ layer interconnect.

* * * * *